United States Patent
Koto et al.

(10) Patent No.: US 7,737,735 B2
(45) Date of Patent: Jun. 15, 2010

(54) OUTPUT CIRCUIT FOR OUTPUTTING A SIGNAL WITH A HIGH-VOLTAGE AMPLITUDE

(75) Inventors: Masaaki Koto, Osaka (JP); Kazuhito Kimura, Kyoto (JP); Kazuyuki Moritake, Osaka (JP); Takuya Ishii, Osaka (JP)

(73) Assignee: Panasonic Corporation, Osaka (JP)

( * ) Notice: Subject to any disclaimer, the term of this patent is extended or adjusted under 35 U.S.C. 154(b) by 47 days.

(21) Appl. No.: 12/059,789

(22) Filed: Mar. 31, 2008

(65) Prior Publication Data
US 2008/0252354 A1 Oct. 16, 2008

(30) Foreign Application Priority Data
Apr. 12, 2007 (JP) ............................. 2007-105166

(51) Int. Cl.
*H03K 3/00* (2006.01)
(52) U.S. Cl. ............................. 327/108; 327/112; 326/83
(58) Field of Classification Search ................. 327/108, 327/112; 326/82, 83
See application file for complete search history.

(56) References Cited

U.S. PATENT DOCUMENTS

| | | | | | |
|---|---|---|---|---|---|
| 4,857,863 | A | * | 8/1989 | Ganger et al. | ............... 330/264 |
| 5,036,222 | A | * | 7/1991 | Davis | ........................... 326/27 |
| 5,237,213 | A | * | 8/1993 | Tanoi | .......................... 327/205 |
| 5,672,983 | A | * | 9/1997 | Yamamoto et al. | ............. 326/27 |
| 5,872,473 | A | * | 2/1999 | Williams | ..................... 327/108 |

FOREIGN PATENT DOCUMENTS

JP 2001-223575 8/2001

* cited by examiner

*Primary Examiner*—Kenneth B. Wells
(74) *Attorney, Agent, or Firm*—McDermott Will & Emery LLP

(57) ABSTRACT

An output circuit includes an output block and a predrive block for driving the output block based on an input signal. The predrive block has a clamp unit connected between the gate terminal of a first output transistor and the gate terminal of a second output transistor to limit the potential of the gate terminal of the first output transistor to a value of not more than a first potential and limit the potential of the gate terminal of the second output transistor to a value of not less than a second potential.

6 Claims, 5 Drawing Sheets

OUTPUT CIRCUIT FOR OUTPUTTING A SIGNAL WITH A HIGH-VOLTAGE AMPLITUDE

CROSS REFERENCE TO RELATED APPLICATIONS

The teachings of Japanese Patent Application JP 2007-105166, filed Apr. 12, 2007, are entirely incorporated herein by reference, inclusive of the claims, specification, and drawings.

BACKGROUND OF THE INVENTION

The present invention relates to an output circuit and, more particularly, to an output circuit for outputting a signal with a high-voltage amplitude.

As an example of an output circuit for an output signal with a high-voltage amplitude, there has been known one which uses a level shift circuit as shown below (see, e.g., Japanese Unexamined Patent Publication No. 2001-223575).

FIG. 5 shows a structure of the conventional output circuit. As shown in FIG. 5, the conventional output circuit comprises an inverter 121 connected between a low-voltage source terminal $T_{VDD}$ and a ground terminal $T_{VSS}$ and driven by an input signal. The conventional output circuit also comprises a latch circuit 123 including an inverter 124 connected between a high-voltage source terminal $T_{HVDD}$ and a low-voltage logic terminal $T_{HVSS}$ to have an input connected to the output of the inverter 121 via a capacitor 120, and an inverter 125 connected to the output of the latch circuit 123. The output of the inverter 121 and the output of the inverter 125 are each connected to an output circuit 122 connected between the high-voltage source terminal $T_{HVDD}$ and the ground terminal $T_{VSS}$.

The output circuit 122 is composed of a first output transistor MO101 as an N-type MOS (Metal Oxide Semiconductor) transistor and a second output transistor MO102 as a P-type MOS transistor which are connected in this order between the ground terminal $T_{VSS}$ and the high-voltage source terminal $T_{HVDD}$. The connection point between the first output transistor MO101 and the second output transistor MO102 is connected to an output terminal $T_{OUT}$. The first output transistor MO101 has a gate connected to the output of the inverter 121, while the second output transistor MO102 has a gate connected to the output of the inverter 125.

The potential of the ground terminal $T_{VSS}$ is a ground potential $V_{SS}$. The potential of the low-voltage source terminal $T_{VDD}$ is $V_{DD}$. The potential of the high-voltage logic terminal $T_{HVDD}$ is $HV_{DD}$. The potential of the low-voltage logic terminal $T_{HVSS}$ is $HV_{SS}$. The voltage between the low-voltage source terminal $T_{VDD}$ and the ground terminal $T_{VSS}$ and the voltage between the high-voltage source terminal $T_{HVDD}$ and the low-voltage logic terminal $T_{HVSS}$ are each not more than the gate-source breakdown voltage of each of the transistors composing the circuit. The voltage between the high-voltage source terminal $T_{HVDD}$ and the ground terminal $T_{VSS}$ is not less than the gate-source breakdown voltage of each of the transistors.

When an input signal to the input terminal $T_{IN}$ changes to a H level (level $V_{DD}$), the output of the inverter 121 changes to the L level (level $V_{SS}$) to turn OFF the first output transistor MO101. The output of the inverter 121 is inputted to the inverter 124 via the capacitor 120. As a result, the input of the inverter 124 changes to the level $HV_{SS}$ and the output of the latch circuit 123 changes to the level $HV_{DD}$. The change of the output of the latch circuit 123 to the level $HV_{DD}$ brings the output of the inverter 125 to the level $HV_{SS}$ to turn ON the second output transistor MO102. Consequently, the potential of the output terminal $T_{OUT}$ changes to the level $HV_{DD}$.

On the other hand, when the potential of the input terminal $T_{IN}$ changes to the L level, the output of the inverter 121 changes to the H level to turn ON the first output transistor MO101. The output of the inverter 121 is inputted to the inverter 124 via the capacitor 120. As a result, the input of the inverter 124 changes to the level $HV_{DD}$ and the output of the latch circuit 123 changes to the level $HV_{SS}$. The change of the output of the latch circuit 123 to the level $HV_{SS}$ brings the output of the inverter 125 to the level $HV_{DD}$ to turn OFF the second output transistor MO102. Consequently, the potential of the output terminal $T_{OUT}$ changes to the level $HV_{SS}$.

Thus, through the signal transmission by the capacitor 120, it is possible to output a signal with a high-voltage amplitude greater than the amplitude of the gate-source breakdown voltage of each of the transistors composing the circuit.

However, the conventional output circuit described above requires a high-breakdown-voltage capacitor as a capacitor for signal transmission. A process for forming the high-breakdown-voltage capacitor is largely different from a process for forming normal MOS transistors. Consequently, there is the problem of a complicated fabrication process. In addition, to drive an output-stage transistor which has a large gate capacitance, a large drive current becomes necessary so that the capacitor for signal transmission is required to have not only a voltage resistance but also a current capacitance of a given order. This causes the problem that an area occupied by the capacitor for signal transmission increases to prevent a reduction in the size of the output circuit.

SUMMARY OF THE INVENTION

It is therefore an object of the present invention to solve the conventional problems described above and allow the implementation of an output circuit which is easy to design and fabricate and outputs a signal with an amplitude greater than the gate-source breakdown voltage of a transistor composing the circuit without using a capacitor for signal transmission.

To attain the object, the present invention constructs an output circuit which generates a drive signal for a first output transistor from a common potential and generates a drive signal for a second output transistor from a source potential.

Specifically, the output circuit according to the present invention comprises: an output block having a first output transistor of a first conductivity type and a second output transistor of a second conductivity type which are connected in series between a common potential line and a source potential line; and a predrive block for driving the first output transistor and the second output transistor each based on an input signal, wherein the predrive block has a first transistor of the first conductivity type driven by a first signal generated from the input signal to short-circuit a gate terminal of the first output transistor and the common potential line, a second transistor of the second conductivity type driven by a second signal generated from the input signal to short-circuit a gate terminal of the second output transistor and the source potential line, and a clamp unit connected between the gate terminal of the first output transistor and the gate terminal of the second output transistor to limit a potential of the gate terminal of the first output transistor to a value of not more than a first potential and limit a potential of the gate terminal of the second output transistor to a value of not less than a second potential, wherein a potential difference between the first potential and the common potential is not more than a gate-source breakdown voltage of the first output transistor, and a potential difference between the second potential and the source potential is not more than a gate-source breakdown voltage of the second output transistor.

In the output circuit according to the present invention, the predrive block for driving the output block has the clamp unit for limiting the potential of the gate terminal of the first output transistor to a value of not more than the first potential and limiting the potential of the gate terminal of the second output transistor to a value of not less than the second potential. As a result, the first output transistor is driven based on the common potential and the second output transistor is driven based on the source potential. Therefore, even when the potential difference between the common potential and the source potential is not less than the gate-source breakdown voltage of the transistor, there is no application of a voltage of not less than the gate-source breakdown voltage to each of the first output transistor and the second output transistor. This allows the implementation of an output circuit which is easy to design and fabricate and outputs a signal with an amplitude greater than the gate-source breakdown voltage of each of the transistors composing the circuit without using a capacitor for signal transmission.

DETAILED DESCRIPTION OF THE INVENTION

Embodiment 1

Figure 1:
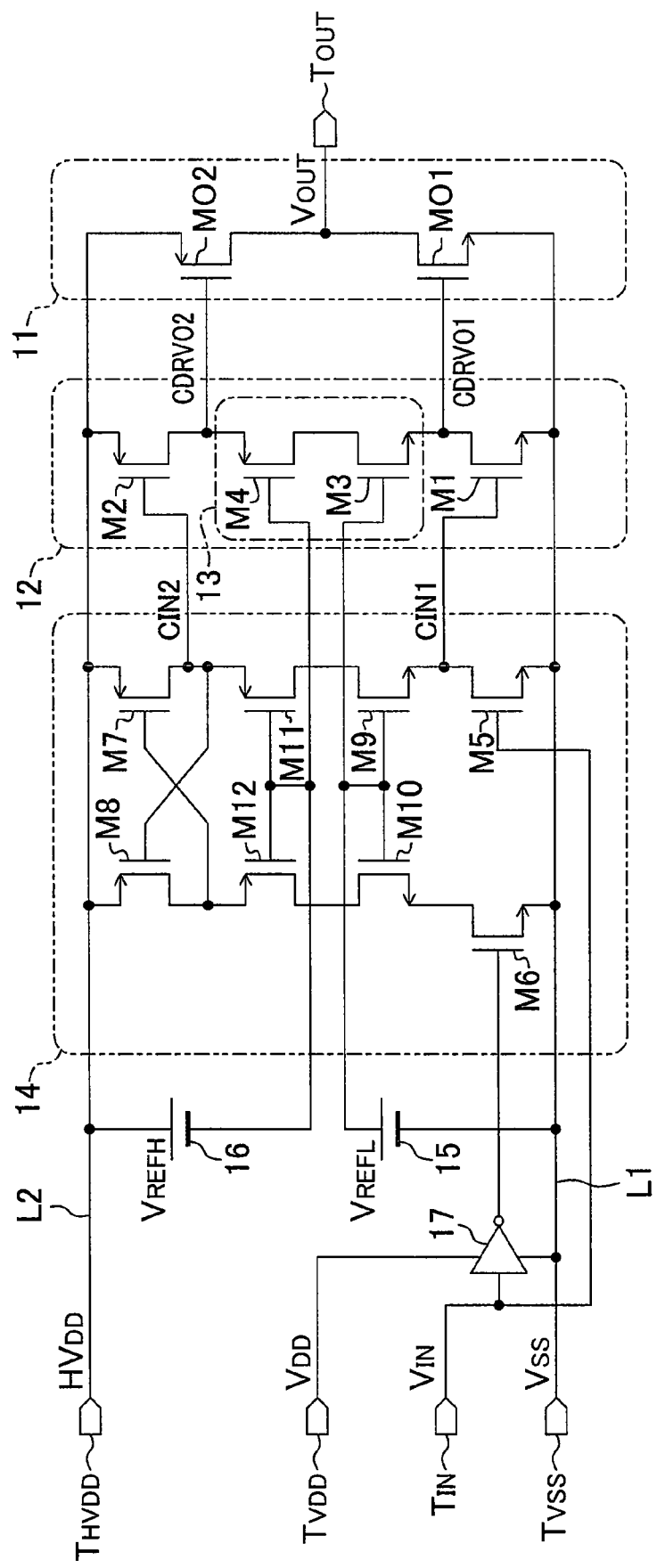
FIG. 1 is a circuit diagram showing an output circuit according to a first embodiment of the present invention.

A first embodiment of the present invention will be described with reference to the drawings. FIG. 1 shows a circuit structure of an output circuit according to the first embodiment.

As shown in FIG. 1, the output circuit according to the present embodiment is a CMOS (Complementary MOS) semiconductor device which is a combination of complementary pairs of N-type MOS transistors and P-type MOS transistors. An input signal $V_{IN}$ with an amplitude of not more than the gate-source breakdown voltage of the CMOS semiconductor device, which is inputted from an input terminal $T_{IN}$, is outputted as an output signal $V_{OUT}$ having an amplitude of not less than the gate-source breakdown voltage of the CMOS semiconductor device from an output terminal $T_{OUT}$.

The output circuit comprises an output block 11 composed of a first output transistor MO1 as an N-type MOS transistor and a second output transistor MO2 as a P-type MOS transistor which are connected in series between a common potential line L1 applied with a common potential $V_{SS}$ and a source potential line L2 applied with a source potential $HV_{DD}$. The connection node between the first output transistor MO1 and the second output transistor MO2 is an output terminal $T_{OUT}$. In the present embodiment, the reference potential $V_{SS}$ is a ground potential and the voltage between the reference potential $V_{SS}$ and the source potential $HV_{DD}$ is a high source voltage of not less than the gate-source breakdown voltage of the CMOS semiconductor device.

To the respective gate terminals of the first output transistor MO1 and the second output transistor MO2, a first drive signal CDRVO1 and a second drive signal CDRVO2 are inputted. The first drive signal CDRVO1 and the second drive signal CDRVO2 are each generated from a predrive block 12.

The predrive block 12 is composed of an N-type first transistor M1, an N-type third transistor M3, a P-type fourth transistor M4, and a P-type second transistor M2 which are connected in series between the common potential line L1 and the source potential line L2. The third transistor M3 and the fourth transistor M4 constitute a clamp unit 13 for limiting the respective potentials of the first drive signal CDRVO1 and the second drive signal CDRVO2.

The connection node between the first transistor M1 and the third transistor M3 is an output node for the first drive signal CDRVO1, which is connected to the gate terminal of the first output transistor MO1. The connection node between the second transistor M2 and the fourth transistor M4 is an output node for the second drive signal CDRVO2, which is connected to the gate terminal of the second output transistor MO2.

To the respective gate terminals of the first transistor M1 and the second transistor M2, a first signal CIN1 and a second signal CIN2 are inputted. The first signal CIN1 and the second signal CIN2 are each generated in a level shift unit 14. To the gate terminal of the third transistor M3, a first bias voltage $V_{REFL}$ is inputted. To the gate terminal of the fourth transistor M4, a second bias voltage $V_{REFH}$ is inputted. The first bias voltage $V_{REFL}$ is supplied from a first voltage source 15 having a positive electrode connected to the source potential line L2. The second bias voltage $V_{REFH}$ is supplied from a second voltage source 16 having a negative electrode connected to the ground potential line L1.

The level shift unit 14 has an N-type fifth transistor M5, an N-type ninth transistor M9, a P-type eleventh transistor M11, a P-type seventh transistor M7, an N-type sixth transistor M6, an N-type tenth transistor M10, a P-type twelfth transistor M12, and a P-type eighth transistor M8 which are connected in series between the common potential line L1 and the source potential line L2.

The connection node between the fifth transistor M5 and the ninth transistor M9 is an output node for the first signal CIN1, which is connected to the gate terminal of the first transistor M1. The connection node between the seventh transistor M7 and the eleventh transistor M11 is an output node for the second signal CIN2, which is connected to the gate terminal of the second transistor M2.

The gate terminal of the fifth transistor M5 is connected to the input terminal $T_{IN}$. The gate terminal of the sixth transistor M6 is connected to the input terminal $T_{IN}$ with an inverter 17 interposed therebetween. The inverter 17 is biased with a low source voltage supplied from a terminal $T_{VDD}$ to invert the input signal $V_{IN}$ inputted to the input terminal $T_{IN}$ and output the inverted input signal $V_{IN}$.

The respective gate terminals of the ninth transistor M9 and the tenth transistor M10 are each connected to the first voltage source 15 to receive the first bias voltage $V_{REFL}$. The respective gate terminals of the eleventh transistor M11 and the twelfth transistor M12 are each connected to the second voltage source 16 to receive the second bias voltage $V_{REFH}$.

The gate terminal of the seventh transistor M7 is connected to the connection node between the eighth transistor M8 and the twelfth transistor M12. The gate terminal of the eighth transistor M8 is connected to the connection node between the seventh transistor M7 and the eleventh transistor M11.

A description will be given hereinbelow to an operation of the output circuit according to the present embodiment. When the input signal $V_{IN}$ inputted to the input terminal $T_{IN}$ first changes from the level $V_{SS}$ as a L level to the level $V_{DD}$ as a H level, the N-type fifth transistor M5 of the level shift unit 14 is turned ON, while the N-type sixth transistor M6 thereof is turned OFF. The turning ON of the fifth transistor M5 lowers the level of the first signal CIN1 outputted from the level shift unit 14 to the level $V_{SS}$ as the L level.

The turning OFF of the sixth transistor M6 raises the potential of the drain of the sixth transistor M6. However, the drain potential of the sixth transistor M6 is clamped to a potential at which the N-type tenth transistor M10 having a gate terminal applied with the first bias voltage $V_{REFL}$ is turned OFF. When the threshold value of the gate-source voltage at which an N-type MOS transistor is turned OFF is assumed to be $V_{tn}$, the drain potential of the sixth transistor M6 becomes ($V_{REFL}-V_{tn}$).

On the other hand, the turning ON of the fifth transistor M5 lowers the level of the second signal CIN2 so that the P-type eighth transistor M8 is turned ON and the drain potential of the eighth transistor M8 rises to the high source voltage $HV_{DD}$. This turns OFF the P-type seventh transistor M7 and lowers the level of the second signal CIN2. However, the level of the second signal CIN2 is clamped to a potential at which the P-type eleventh transistor M11 having a gate terminal of which the voltage level has been brought to ($HV_{DD}-V_{REFH}$) by the second bias voltage $V_{REFH}$ is turned OFF. When the threshold value of the gate-source voltage at which a P-type MOS transistor is turned OFF is assumed to be $V_{tp}$, the level of the second signal CIN2 becomes ($HV_{DD}-V_{REFH}+V_{tp}$) as the L level.

When each of the first signal CIN1 and the second signal CIN2 changes from the H level to the L level, the N-type first transistor M1 and the N-type third transistor M3 are each turned OFF and the P-type second transistor M2 and the P-type fourth transistor M4 are each turned ON in the predrive block 12. As a result, the potential of the first drive signal CDRVO1 becomes ($V_{REFL}-V_{tn}$), while the potential of the second drive signal CDRVO2 becomes $HV_{DD}$. This turns ON the N-type first output transistor MO1 and turns OFF the P-type second output transistor MO2 in the output block 11. Accordingly, the output signal $V_{OUT}$ outputted from the output terminal $T_{OUT}$ changes to the $V_{SS}$ level.

Then, when the input signal $V_{IN}$ inputted to the input terminal $T_{IN}$ changes from the level $V_{DD}$ as the H level to the level $V_{SS}$ as the L level, a logic operation inverse to the logic operation described above is performed. That is, the fifth transistor M5 and the eighth transistor M8 are each turned OFF and the sixth transistor M6 and the seventh transistor M7 are each turned ON in level shift unit 14. As a result, the level of the first signal CIN1 becomes ($V_{REFL}-V_{tn}$) as the H level. On the other hand, the potential of the drain of the eighth transistor M8 becomes ($HV_{DD}-V_{REFH}+V_{tp}$), while the level of the second signal CIN2 becomes the high source voltage $HV_{DD}$ as the H level.

When each of the first signal CIN1 and the second signal CIN2 changes from the L level to the H level, the N-type first transistor M1 is turned ON, while the P-type second transistor M2 is turned OFF. The turning ON of the first transistor M1 lowers the level of the first drive signal CDRVO1 of the predrive block 12 to $V_{SS}$. On the other hand, the turning OFF of the second transistor M2 lowers the level of the second drive signal CDRVO2 of the predrive block 12. However, the level of the second drive signal CDRVO2 is clamped to a potential at which the fourth transistor M4 having a gate terminal applied with the second bias voltage $V_{REFH}$ is turned OFF. Accordingly, the level of the second drive signal CDRVO2 becomes ($HV_{DD}-V_{REFL}+V_{tp}$). As a result, the first output transistor MO1 is turned OFF and the second output transistor MO2 is turned ON in the output block 11 so that the potential of the output signal $V_{OUT}$ outputted from the output terminal $T_{OUT}$ changes to the level $HV_{DD}$.

Figure 2:
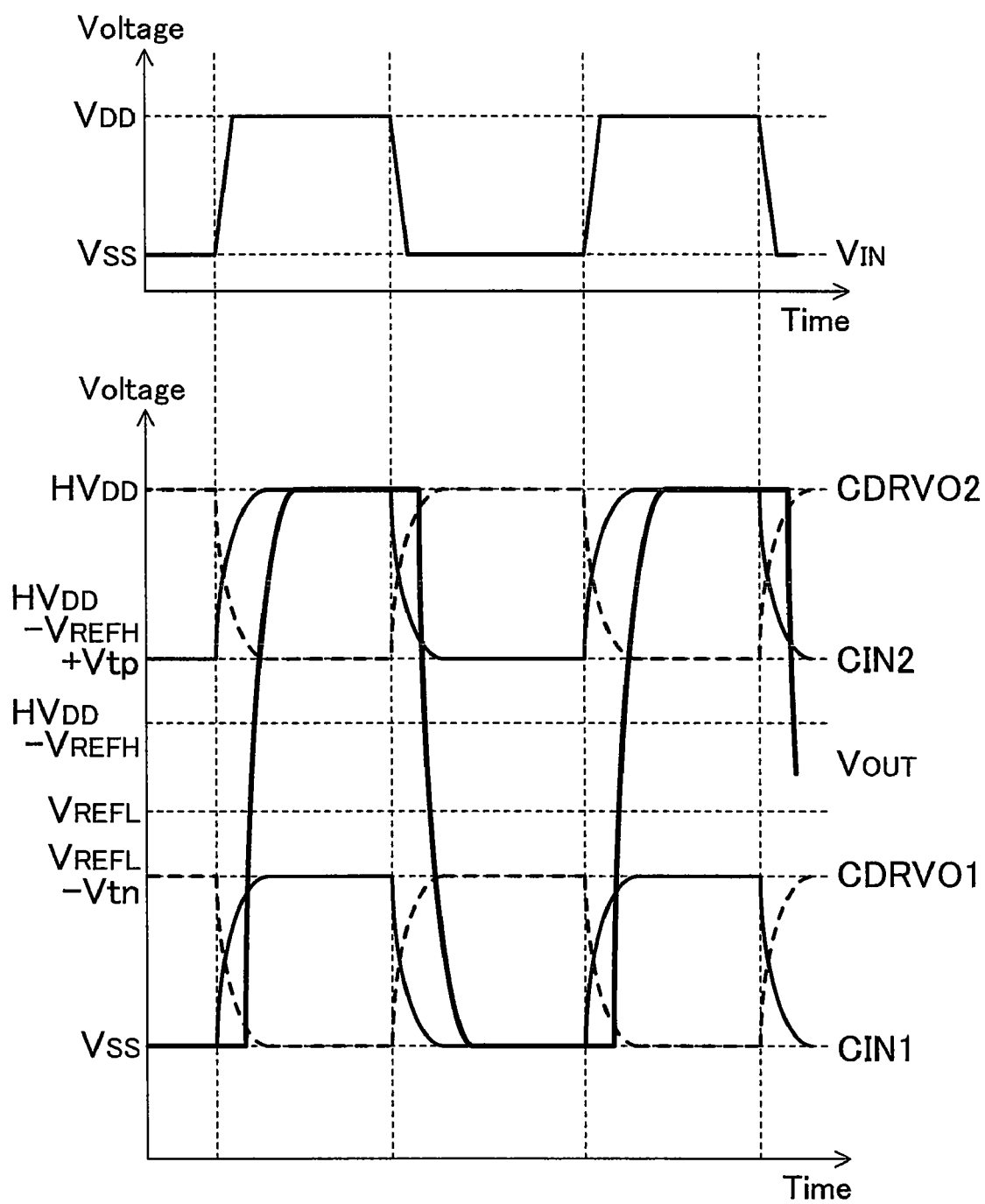
FIG. 2 is a waveform chart showing an operation of the output circuit according to the first embodiment.

FIG. 2 shows an operation waveform of the output circuit according to the first embodiment shown in FIG. 1. In accordance with the input signal $V_{IN}$, the first signal CIN1 fluctuates between the level $V_{SS}$ and the level ($V_{REFL}-V_{tn}$) and the second signal CIN2 fluctuates between the level ($HV_{DD}-V_{REFH}+V_{tp}$) and the level $HV_{DD}$. In response to this, the output $V_{OUT}$ fluctuates between the level $HV_{DD}$ and the level $V_{SS}$.

The output circuit in the first embodiment is allowed to output the output signal $V_{OUT}$ with an amplitude greater than the gate-source breakdown voltage of the CMOS semiconductor device by setting each of the levels ($V_{REFL}-V_{tn}$) and ($V_{REFH}-V_{tp}$) to a value not greater than the gate-source breakdown voltage of the CMOS semiconductor device.

Embodiment 2

Figure 3:
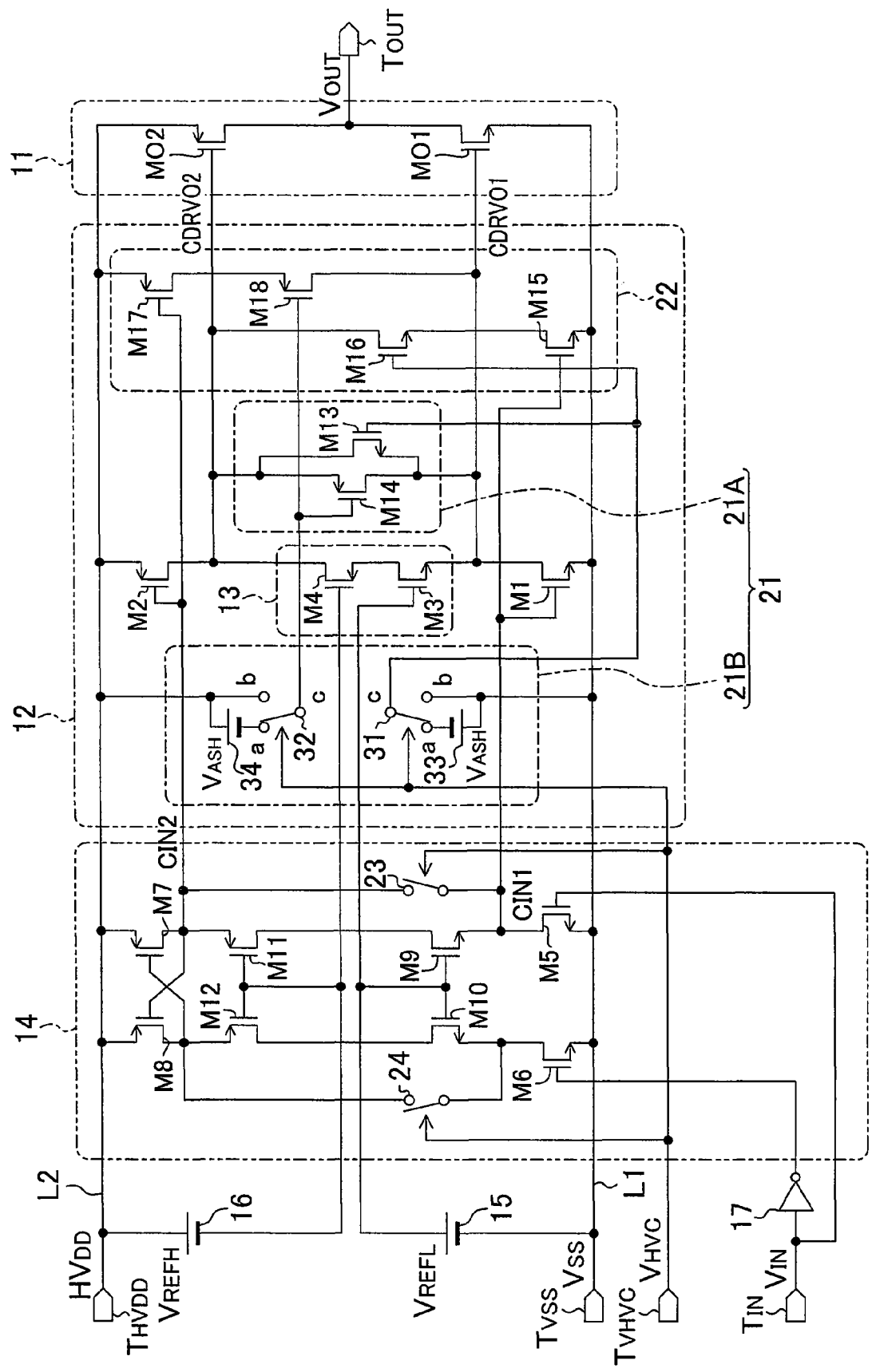
FIG. 3 is a circuit diagram showing an output circuit according to a second embodiment of the present invention.

A second embodiment of the present invention will be described with reference to the drawings. FIG. 3 shows a circuit structure of an output circuit according to the second embodiment. A description of the components shown in FIG. 3 which are the same as those shown in FIG. 1 will be omitted by providing the same reference numerals.

The output circuit according to the present embodiment is not only capable of outputting an output signal with a high-voltage amplitude of not less than the gate-source breakdown voltage but also wide in the operating range of a high source voltage applied between the output signal terminal $T_{HVDD}$ and the terminal $T_{VSS}$. The output circuit according to the present embodiment can perform a high-speed driving operation even when the lower-limit value thereof is under the gate-source breakdown voltage of each of the transistors composing the circuit.

The first bias voltage $V_{REFL}$ and the second bias voltage $V_{REFH}$ may be set appropriately such that each of the values ($V_{REFL}-V_{tn}$) and ($V_{REFH}-V_{tp}$) does not exceed the gate-source breakdown voltage of each of the transistors. However, the first bias voltage $V_{REFL}$ and the second bias voltage $V_{REFH}$ cannot be raised to values higher than the high source voltage.

Consequently, when the high source voltage applied between the terminal $T_{HVDD}$ and the terminal $T_{VSS}$ is low, respective gate voltages applied to the third and fourth transistors M3 and M4 in the clamp unit 13 and to the ninth to twelfth transistors M9 to M12 for clamping in the level shift unit 14 become short of so that the ON-state resistances of the transistors increase. As a result, each of the clamp unit 13 and the level shift unit 14 becomes high in resistance and cannot operate the output circuit at a high speed.

On the other hand, when the high source voltage is lower than the gate-source breakdown voltage of each of the transistors, the clamp unit 13 and the level shift unit 14 are unnecessary. Therefore, the output circuit according to the present embodiment is allowed to be driven at a high speed even when the high source voltage is lower than the gate-source breakdown voltage of each of the transistors, as will be described hereinbelow.

In the output circuit according to the present embodiment, the predrive block 12 has a switch unit 21 and a speed-up circuit unit 22. In addition, the level shift unit 14 has a first short-circuit switch 23 and a second short-circuit switch 24.

The first short-circuit switch 23 and the second short-circuit switch 24 are each controlled by a control signal $V_{HVC}$ inputted from a control terminal $T_{VHVC}$. The control signal $V_{HVC}$ changes based on the potential difference between the source potential $HV_{DD}$ and the ground potential $V_{SS}$. In the present embodiment, the control signal $V_{HVC}$ changes to the L level at a voltage of not less than a predetermined value higher than the first bias voltage $V_{REFL}$ or the second bias voltage $V_{REFH}$, while it changes to the H level at a voltage lower than the predetermined value.

The first short-circuit switch 23 short-circuits the output node for the first signal CIN1 and the output node for the second signal CIN2 in the level shift unit 14 when the control signal $V_{HVC}$ is on the H level. The second short-circuit switch 24 short-circuits the drain of the sixth transistor M6 and the drain of the eighth transistor M8 when the control signal $V_{HVC}$ is on the H level.

The switch unit 21 short-circuits the output node for the first drive signal CDRVO1 and the output node for the second drive signal CDRVO2 when the control signal $V_{HVC}$ is on the H level. The switch unit 21 has a short-circuit circuit 21A composed of an N-type thirteenth transistor M13 and a P-type fourteenth transistor M14 which are connected in parallel between the output node for the first drive signal CDRVO1 and the output node for the second drive signal CDRVO2, and a short-circuit control circuit 21B for controlling the short-circuit circuit 21A.

The short-circuit control circuit 21B has a first switch 31 and a second switch 32 each controlled by the control signal $V_{HVC}$, a third voltage source 33 having a negative electrode connected to the common potential line L1 to supply a third bias voltage $V_{ASL}$, and a fourth voltage source 34 having a positive electrode connected to the source potential line L2 to supply a fourth bias voltage $V_{ASH}$. The first switch 31 has a common terminal c connected to the gate terminal of the thirteenth transistor M13, a contact point a connected to the positive electrode of the third voltage source 33, and a contact point b connected to the common potential line L1. The second switch 32 has a common terminal c connected to the gate terminal of the fourteenth transistor M14, a contact point a connected to the negative electrode of the fourth voltage source 34, and a contact point b connected to the source potential line L2. As a result, when the control signal $V_{HVC}$ is on the H level, the gate terminal of the thirteenth transistor M13 is connected to the positive electrode of the third voltage source 33 and the gate terminal of the fourteenth transistor M14 is connected to the negative electrode of the fourth voltage source 34. When the control signal $V_{HVC}$ is on the L level, the gate terminal of the thirteenth transistor M13 and the gate terminal of the fourteenth transistor M14 are each connected to the common potential line L1.

The speed-up circuit unit 22 has an N-type fifteenth transistor M15 and an N-type sixteenth transistor M16, which are connected in series between the common potential line L1 and the output node for the second drive signal CDRVO2, and a P-type seventeenth transistor M17 and a P-type eighteenth transistor M18, which are connected in series between the source potential line L2 and the output node for the first drive signal CDRVO1.

The gate terminal of the fifteenth transistor M15 is connected to the output node for the first signal CIN1. The gate terminal of the sixteenth transistor M16 is connected to the common terminal c of the first switch 31 of the short-circuit control circuit 21B. The gate terminal of the seventeenth transistor M17 is connected to the output node for the second signal CIN2. The gate terminal of the eighteenth transistor M18 is connected to the common terminal c of the second switch 32.

A description will be given hereinbelow to an operation of the output circuit according to the second embodiment shown in FIG. 3. The description will be given first to the operation when the high source voltage supplied to the terminal $T_{HVDD}$ is not less than a predetermined value and the control signal $V_{HVC}$ is on the L level.

In the level shift unit 14, the first short-circuit switch 23 and the second short-circuit switch 24 are each in the OFF state, and the level shift unit 14 performs the same operation as in the first embodiment. In the switch unit 21 of the predrive block 12, each of the first switch 31 and the second switch 32 has the common terminal c connected to the terminal b thereof. Accordingly, the gate terminal of the thirteenth transistor M13 is on the level $V_{SS}$ and turned OFF, while the gate terminal of the fifteenth transistor M14 is on the level $HV_{DD}$ and turned OFF. In the speed-up circuit unit 22 also, the sixteenth transistor M16 and the eighteenth transistor M18 are each turned OFF. As a result, the predrive block 12 performs the same operation as in the first embodiment.

The description will be given next to the operation when the high source voltage supplied to the terminal $T_{HVDD}$ is not more than the predetermined value and the control signal $V_{HVC}$ is on the H level.

In level shift unit 14, the first short-circuit switch 23 and the second short-circuit switch 24 are each turned ON so that the ninth to twelfth transistors M9 to M12 composing the clamp circuit do not operate. In the predrive block 12, the clamp unit 13 does not operate so that each of the first and second switches 31 and 32 of the switch unit 21 has the common terminal c connected to the terminal a thereof. Accordingly, the gate terminal of the thirteenth transistor M13 is on the level $V_{ASL}$ and turned ON, while the gate terminal of the fourteenth transistor M14 is on the level $(HV_{DD}-V_{ASH})$ and turned ON. This short-circuits the output node for the first drive signal CDRVO1 and the output node for the second drive signal CDRVO2 in the predrive block 12. In the speed-up circuit unit 22, the third bias voltage $V_{ASL}$ is applied to the gate terminal of the sixteenth transistor M16 to turn it ON, while the fourth bias voltage $V_{ASH}$ is applied to the gate terminal of the eighteenth transistor M18 to turn it ON. As a result, the level shift unit 14 and the predrive block 12 perform the following operation in accordance with the input signal $V_{IN}$ inputted to the input terminal $V_{IN}$.

First, when the input signal $V_{IN}$ changes from the level $V_{SS}$ as the L level to the level $HV_{DD}$ as the H level, the fifth transistor M5 is turned ON and the sixth transistor M6 is turned OFF in the level shift unit 14. As a result, each of the first signal CIN1 and the second signal CIN2 changes to the level $V_{SS}$ as the L level. In the predrive block 12, the first transistor M1 is turned OFF and the second transistor M2 is turned ON. Accordingly, the first drive signal CDRVO1 changes to the level $HV_{DD}$ as the H level. Since the output node for the first drive signal CDRVO1 and the output node for the second drive signal CDRVO2 have been short-circuited by the thirteenth transistor M13 and the fourteenth transistors M14, the second drive signal CDRVO2 also changes to the level $HV_{DD}$ as the H level. In the output block 11, the gate of the first output transistor MO1 is driven by the first drive signal CDRVO1 and the gate of the second output transistor MO2 is driven by the second drive signal CDRVO2. As a result, the first output transistor MO1 is turned ON and the second output transistor MO2 is turned OFF so that the output signal $V_{OUT}$ changes to the level $V_{SS}$ as the L level.

Next, when the input signal $V_{IN}$ changes from the H level to the L level, the fifth transistor M5 is turned OFF and the sixth transistor M6 is turned ON in the level shift unit 14. This brings each of the first and second signals CIN1 and CIN2 to the H level. As a result, the first transistor M1 is turned ON and the second transistor M2 is turned OFF in the predrive block 12. This also brings each of the first drive signal CDRVO1 and the second drive signal CDRVO2 to the level $V_{SS}$. In the output block 11, the first output transistor MO1 is turned OFF and the second output transistor MO2 is turned ON so that the output signal $V_{OUT}$ changes to the level $HV_{DD}$ as the H level.

Further, when the control signal $V_{HVC}$ is on the H level, the third bias voltage $V_{ASL}$ is applied to the gate terminal of the sixteenth transistor M16 to turn it ON and the fourth bias voltage $V_{ASH}$ is applied to the gate terminal of the eighteenth transistor M18 to turn it ON in the speed-up circuit unit 22. To the gate terminal of the fifteenth transistor M15, the same first signal CIN1 as applied to the gate terminal of the first transistor M1 is applied. To the gate terminal of the seventeenth transistor M17, the same second signal CIN2 as applied to the gate terminal of the second transistor M2 is applied. As a result, the fifteenth transistor M15 can bring the second drive signal CDRVO2 to the level $V_{SS}$ via the sixteenth transistor M16. On the other hand, the seventeenth transistor M17 can bring the first drive signal CDRVO1 to the level $HV_{DD}$ via the eighteenth transistor M18. This allows each of the first drive signal CDRVO1 and the second drive signal CDRVO2 to change at a high speed without receiving the influence of the clamp unit 13, the switch unit 21, or the like which has a high resistance.

Figure 4A:
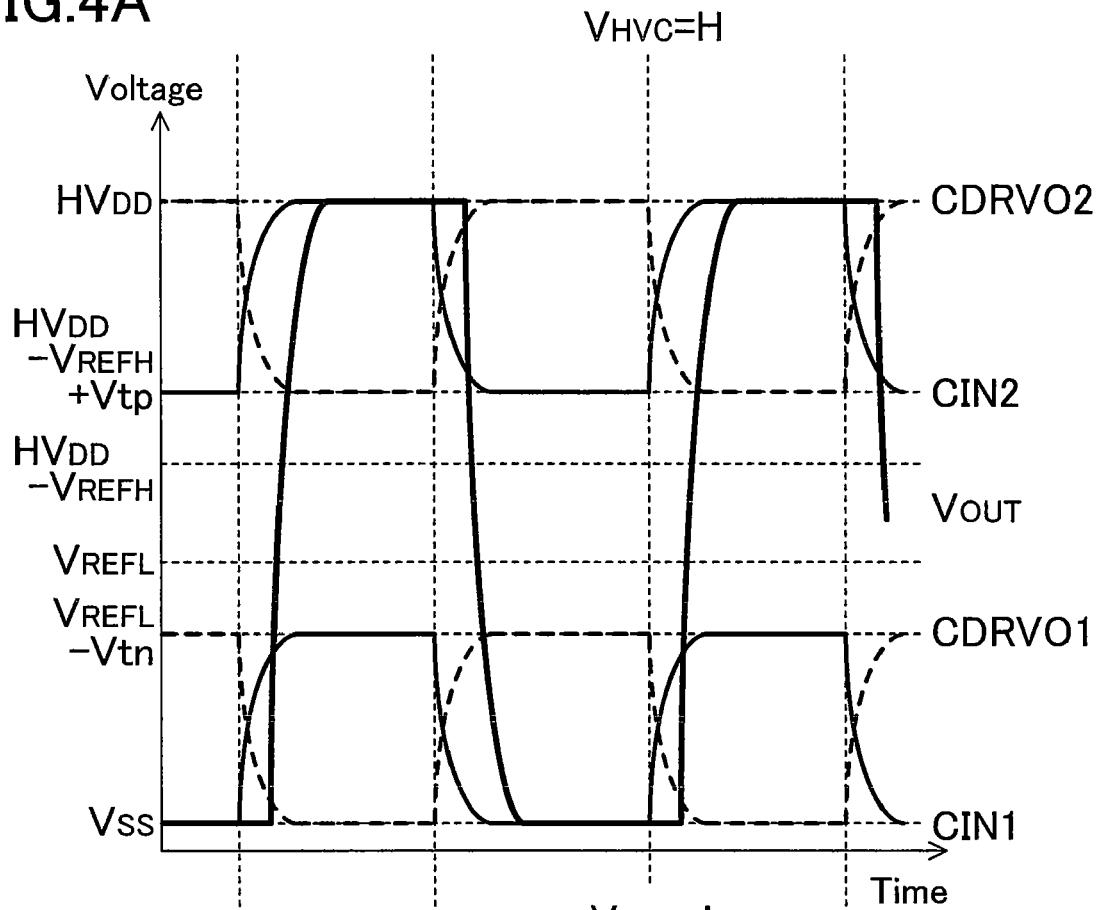
FIG. 4 is a waveform chart showing an operation of the output circuit according to the second embodiment.
Figure 4B:
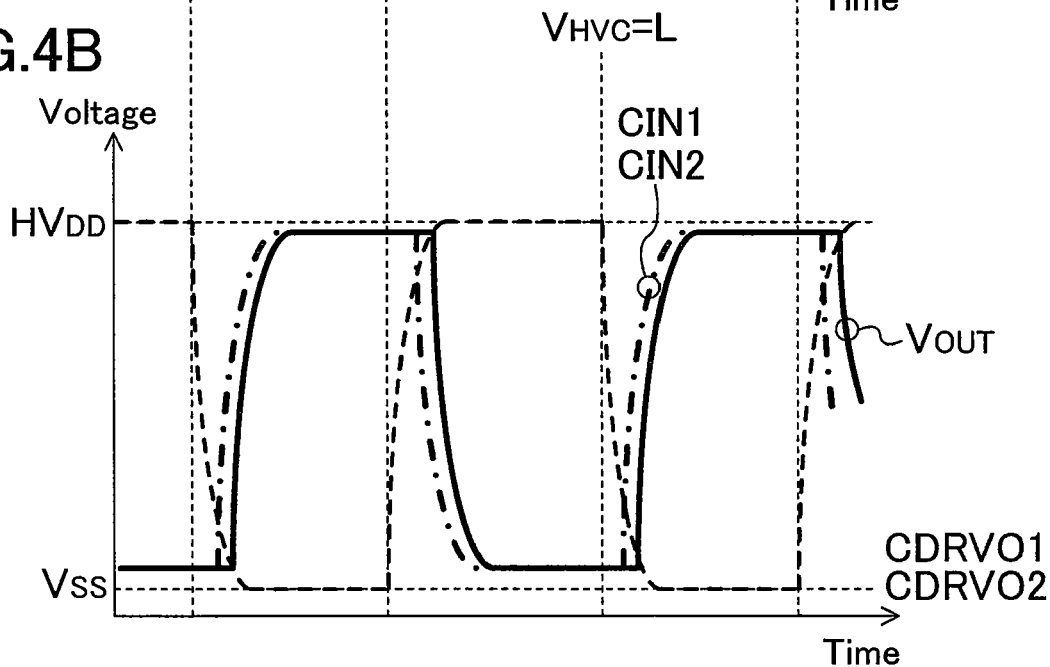
Figure 5:
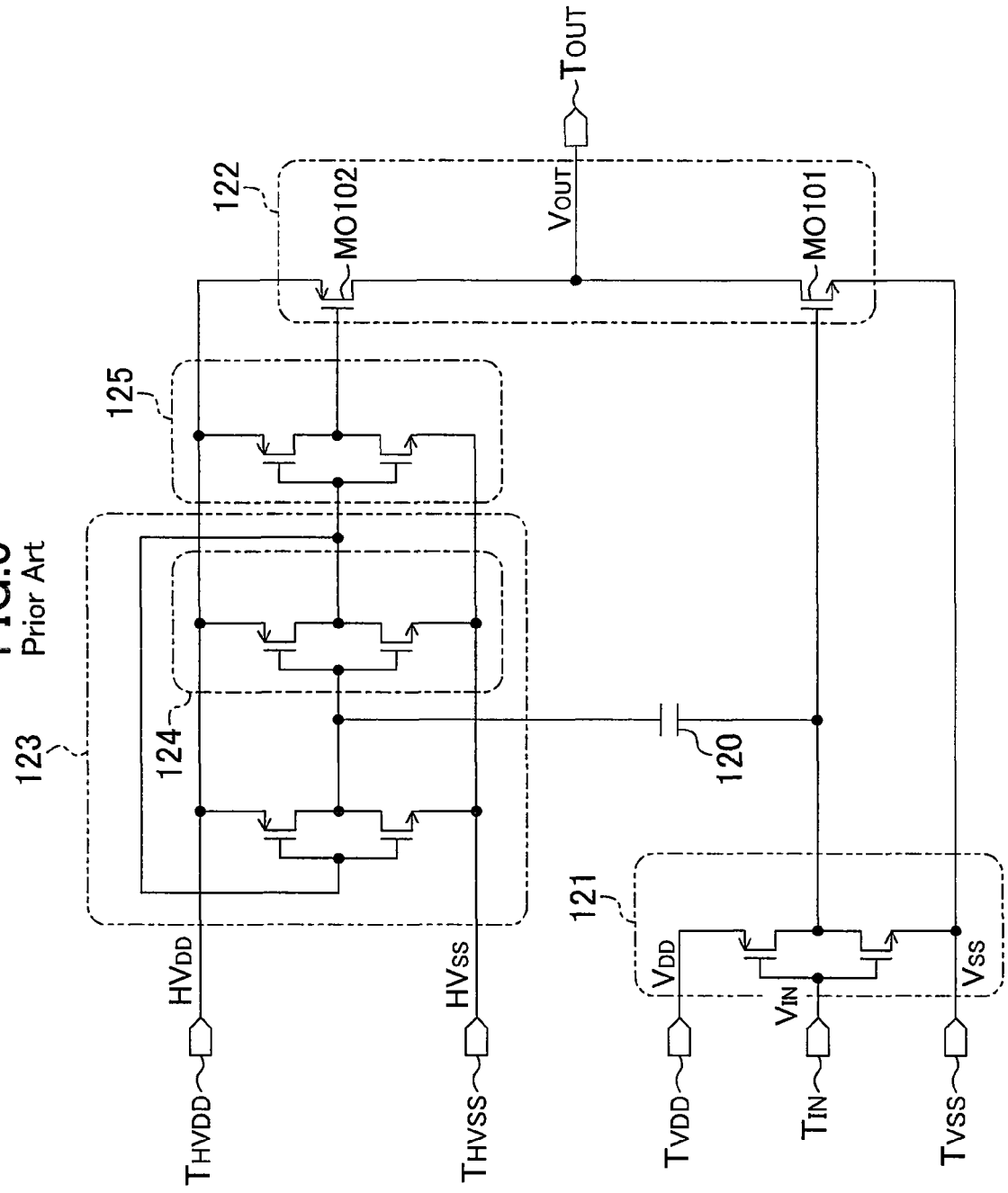
FIG. 5 is a circuit diagram showing a conventional output circuit.

FIGS. 4A and 4B show operation waveforms of the output circuit according to the second embodiment shown in FIG. 3, of which FIG. 4A shows the case where the high source voltage applied between the terminal $T_{HVDD}$ and the terminal $T_{VSS}$ is high and the control signal $V_{HVC}$ is on the H level and FIG. 4B shows the case where the high source voltage is low and the control signal $V_{HVC}$ is on the L level.

When the control signal $V_{HVC}$ is on the H level, the first drive signal CDRVO1 fluctuates between the level $V_{SS}$ and the level ($V_{REFL}-V_{tn}$), while the second drive signal CDRVO2 fluctuates between the level ($HV_{DD}-V_{REFH}+V_{tp}$) and the level $HV_{DD}$, as shown in FIG. 4A. On the other hand, when the control signal $V_{HVC}$ is on the L level, the switch unit 21 and the speed-up circuit unit 22 operate so that the waveform of the first drive signal CDRVO1 becomes equal to that of the second drive signal CDRVO2, as shown in FIG. 4B. As a result, each of the first signal CDRVO1 and the second drive signal CDRVO2 fluctuates between the level $V_{SS}$ and the level $HV_{DD}$.

In the output circuit according to the second embodiment, the operating range of the high source voltage applied between the terminal $T_{HVDD}$ and the terminal $V_{SS}$ is wide. Therefore, the output circuit according to the second embodiment is allowed to operate at a high speed even when the lower-limit value thereof is under the gate-source breakdown voltage of the CMOS semiconductor device.

As described above, the output circuit according to the present invention can implement an output circuit which is easy to design and fabricate and outputs a signal with an amplitude greater than the gate-source breakdown voltage of each of transistors composing the circuit. Therefore, the output circuit according to the present invention is useful as an output circuit for outputting a signal with a high-voltage amplitude or the like.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An output circuit comprising:
    an output block having a first output transistor of a first conductivity type and a second output transistor of a second conductivity type which are connected in series between a common potential line and a source potential line;
    a predrive block for driving the output block based on an input signal;
    a first voltage source for generating a first bias voltage from the common potential; and
    a second voltage source for generating a second bias voltage from the source potential,
    wherein the predrive block has a first transistor of the first conductivity type driven by a first signal generated from the input signal to short-circuit a gate terminal of the first output transistor and the common potential line,
    a second transistor of the second conductivity type driven by a second signal generated from the input signal to short-circuit a gate terminal of the second output transistor and the source potential line, and
    a clamp unit connected between the gate terminal of the first output transistor and the gate terminal of the second output transistor to limit a potential of the gate terminal of the first output transistor to a value of not more than a first potential and limit a potential of the gate terminal of the second output transistor to a value of not less than a second potential,
    a potential difference between the first potential and the common potential is not more than a gate-source breakdown voltage of the first output transistor,
    a potential difference between the second potential and the source potential is not more than a gate-source breakdown voltage of the second output transistor,
    the clamp unit has a third transistor of the first conductivity type controlled with the first bias voltage and a fourth transistor of the second conductivity type controlled with the second bias voltage,
    the third transistor and the fourth transistor are connected in this order between the gate terminal of the first output transistor and the gate terminal of the second output transistor,
    a difference between the first bias voltage and a threshold voltage of the third transistor is not more than the gate-source breakdown voltage of the first output transistor, and
    a difference between the second bias voltage and a threshold voltage of the fourth transistor is not more than the gate-source breakdown voltage of the second output transistor.

2. The output circuit of claim 1, further comprising:
    a level shift unit for generating the first signal and the second signal each from the input signal, wherein
    the level shift unit limits a high level of the first signal based on the first bias voltage, limits a low level of the second signal based on the second bias voltage, and outputs the first signal and a second signal as in-phase signals.

3. The output circuit of claim 1, wherein the predrive block has a switch unit for short-circuiting the clamp unit when the source potential is not more than a predetermined value.

4. The output circuit of claim 3, wherein the switch unit has a fifth transistor of the first conductivity type and a sixth transistor of the second conductivity type each for short-circuiting the clamp unit.

5. The output circuit of claim 3, wherein the predrive block has a speed-up unit for short-circuiting the gate terminal of the first output transistor and the source potential line in synchronization with the first transistor and short-circuiting the gate terminal of the second output transistor and the common potential line in synchronization with the second transistor when the source potential is not more than the predetermined value.

6. The output circuit of claim 5, wherein the speed-up unit has a seventh transistor of the first conductivity type,
an eighth transistor of the first conductivity type,
a ninth transistor of the second conductivity type, and
a tenth transistor of the second conductivity type, wherein
the seventh transistor and the eighth transistor are connected in this order between the common potential line and the gate terminal of the second output transistor such that the first signal is inputted to a gate terminal of the seventh transistor and the eighth transistor is turned on when the source potential is not more than the predetermined value, and
the ninth transistor and the tenth transistor are connected in this order between the source potential line and the gate terminal of the first output transistor such that the second signal is inputted to a gate terminal of the ninth transistor and the tenth transistor is turned on when the source potential is not more than the predetermined value.

* * * * *